US006821381B1

United States Patent
Yamauchi et al.

(10) Patent No.: US 6,821,381 B1
(45) Date of Patent: Nov. 23, 2004

(54) TOOL FOR THERMO-COMPRESSION-BONDING CHIPS, AND CHIP PACKAGING DEVICE HAVING THE SAME

(75) Inventors: Akira Yamauchi, Shiga (JP); Yoshiyuki Arai, Shiga (JP)

(73) Assignee: Toray Engineering Co., Ltd., Osaka (JP)

( * ) Notice: Subject to any disclaimer, the term of this patent is extended or adjusted under 35 U.S.C. 154(b) by 56 days.

(21) Appl. No.: 10/416,839

(22) PCT Filed: Nov. 16, 2000

(86) PCT No.: PCT/JP00/08091

§ 371 (c)(1),
(2), (4) Date: May 15, 2003

(87) PCT Pub. No.: WO02/41385

PCT Pub. Date: May 23, 2002

(51) Int. Cl.⁷ .............................................. B30B 15/34
(52) U.S. Cl. .................... 156/583.1; 100/321; 228/44.7
(58) Field of Search ................................ 156/228, 359, 156/580, 581, 583.1; 100/315, 320, 321, 326; 228/44.3, 44.7, 49.5

(56) References Cited

U.S. PATENT DOCUMENTS

| | | | | |
|---|---|---|---|---|
| 4,255,644 A | * | 3/1981 | Delorme | 219/233 |
| 4,612,081 A | * | 9/1986 | Kasper et al. | 156/583.1 |
| 5,632,434 A | * | 5/1997 | Evans et al. | 228/44.7 |
| 6,347,655 B1 | * | 2/2002 | Yamamoto et al. | 156/540 |

FOREIGN PATENT DOCUMENTS

| | | |
|---|---|---|
| JP | 06-026256 A1 | 4/1994 |
| JP | 06-268029 A1 | 9/1994 |
| JP | 10-041355 A1 | 2/1998 |
| JP | 2000-012629 A1 | 1/2000 |
| JP | 2000-232134 A1 | 8/2000 |
| JP | 2000-260825 A1 | 9/2000 |
| JP | 2000-332061 A1 | 11/2000 |

OTHER PUBLICATIONS

International Search Report for PCT/JP00/08091 mailed on Mar. 13, 2001.
International Preliminary Examination Report completed on Sep. 26, 2001.

* cited by examiner

Primary Examiner—James Sells
(74) Attorney, Agent, or Firm—Rader, Fishman & Grauer PLLC

(57) ABSTRACT

A ceramic holder 2 is mounted on the lower end of a connecting block 30 of metal mounted on the lower end of a tool main body 1 of metal, such ceramic holder 2, a ceramic heater 4 and a ceramic presser 5 being sintered. In addition) the coefficient of linear expansion of the ceramic holder 2 is approximately equal to those of the ceramic heater 4 and ceramic presser 5; furthermore, the thermal conductivities of the ceramic holder 2 and ceramic presser 5 are greater as the pressure side of the ceramic presser 5 as seen from the ceramic heater 4 is approached and are smaller as the attaching surface side of the ceramic holder 2 is approached.

21 Claims, 6 Drawing Sheets

TOOL FOR THERMO-COMPRESSION-BONDING CHIPS, AND CHIP PACKAGING DEVICE HAVING THE SAME

TECHNICAL FIELD

The present invention relates to a tool for thermo-compression-bonding chips, and a chip packaging device having the same.

BACKGROUND ART

Conventionally, there has been known various types of tools for thermo-compression-bonding chips used for thermo-compression-bonding, i.e., packaging chips on a substrate such as a liquid crystal substrate. For example, a tool for thermo-compression-bonding chips is disclosed in JP 7-86341 (1995), wherein a ceramic holder is mounted on the lower end of a tool main body, with a ceramic heater and a ceramic presser being mounted on the lower end of the ceramic holder.

However, the above-mentioned tool for thermo-compression-bonding chips has the following drawbacks. Although a selected adhesive is used for integration of the ceramic holder, ceramic heater and ceramic presser into a single piece (fixation of three components), difference of thermal expansion by the unevenness in thickness of applied adhesive layers and/or degradation of the adhesive with time, or heat strain caused by the difference in temperature of components arisen from low heat conductivity of adhesive, all may cause parallelism to vary with time and become prone to be out of specified range. The parallelism (parallelism of its working surface and a substrate or a substrate holding stage) or flatness (flatness of its working surface) of the ceramic presser, both of which is simply referred to as "parallelism" hereinafter.

In addition, the tool main body and the ceramic heater is usually bolted together, but this bolting is likely to be loosened by the repetition of heating and cooling, because tool main body and bolts are metallic. Furthermore, heat is transferred to a parallelism adjusting mechanism mounted on the upper end portion of the tool main body. These deteriorates the parallelism of the ceramic presser with ease. Parallelism of the ceramic presser is regarded as a decisive factor, especially in packaging which requires a precision of micron order. If it's parallelism is constantly confined within a specified range, a chip positional shift or the like will never occurs in packaging, So it is not difficult to execute packaging with a high precision, for example, of several μm or less.

Therefore, while the present inventors proposed a tool for thermo-compression-bonding in which a ceramic holder, a ceramic heater and a ceramic presser are sintered, no consideration was given to minimize a influence of thermal expansion and heat transfer in the tool; therefore in the course of successive packaging operations, it result ed in difficulty in packaging with high precision constantly, because of the thermal strain in the tool components and thermal expansion of them. The present invention has been made in light of such drawbacks and in order to eliminate the fault, and it is an object of the present invention to confine a parallelism of a tool for thermo-compression-bonding chips under influences of thermal expansion and thermal transfer within a specified range constantly.

DISCLOSURE OF THE INVENTION

The present invention adopts the following configurations in order to achieve above mentioned object.

More specifically, according to one aspect of the present invention, a tool for thermo-compression-bonding chips, comprises: a tool main body; a ceramic holder directly mounted on the lower end of the tool main body or mounted on the lower end of a connecting block mounted on the lower end of the tool main body; and a ceramic heater and ceramic presser sintered to the lower end of the ceramic holder, wherein the coefficient of linear expansion of the ceramic holder is approximately equal to those of the ceramic heater and ceramic presser, and the thermal conductivities of the ceramic holder and ceramic presser are greater as the pressure surface side of the ceramic presser as seen from the ceramic heater is approached and are smaller as the attaching surface side of the ceramic holder opposite to the pressure surface side is approached.

According to another aspect of the present invention, a tool for thermo-compression-bonding chips, comprises: a tool main body; a ceramic holder directly mounted on the lower end of the tool main body or mounted on the lower end of a connecting block mounted on the lower end of the tool main body; and a ceramic heater-presser sintered to the lower end of the ceramic holder, wherein the coefficient of linear expansion of the ceramic holder is approximately equal to that of the ceramic heater-presser, and the thermal conductivity of the ceramic holder is smaller as the attaching surface side of the ceramic holder as seen from the ceramic heater-presser is approached.

According to a tool for thermo-compression-bonding chips of the present invention, the configuration is adopted in which heat is difficult to be transferred to the tool main body and the attaching portion of the ceramic holder in a limited space including the ceramic holder, ceramic heater and ceramic heater-presser or the like, thereby enabling elimination of elongation and deviation (deformation) in parallelism caused by thermal expansion of the tool main body having a parallelism adjusting function.

The ceramic holder is formed by sintering so that a thermal conductivity gradually decreases toward the attaching portion of the ceramic holder from the ceramic heater side or ceramic heater-presser side; furthermore, adopts a lamination structure in which laminated constituents adjacent to each other have the same or approximately the same coefficient of linear expansion as each other to thereby enable reduction in temperature difference between laminated constituents adjacent to each other (a heat transfer rate can be decreased toward in a direction of heat transfer not rapidly but gradually); therefore, enabling thermo-deformation of the ceramic heater-presser, ceramic presser, ceramic heater, ceramic holder and tool main body to be suppressed.

Accordingly, with this lamination structure adopted, heat is transferred to a chip pressing side with ease, while being transferred to a tool main body side having the parallelism adjusting function with difficulty, and since coefficients of linear expansion of constituents are the same or approximately the same as each other, a problem caused by heat transfer can be solved; thereby enabling realization of packaging with a high precision.

In a tool for thermo-compression-bonding chips according to the present invention, it is preferable that ceramic plates are laminated in such a manner that thermal conductivities thereof become greater from the ceramic heater side toward the tool tip end side (the pressure surface side of the ceramic presser) and the ceramic plates are the same or approximately the same as each other in coefficient of linear expansion, thereby enabling influences of strains and elongation associated with heat transfer to be eliminated.

In a tool for thermo-compression-bonding chips according to the present invention, it is preferable that a heat generating section of the ceramic heater and the upper end portion of the ceramic presser are fitted into or sintered to an attaching recess formed on the lower end surface of the ceramic holder, thereby enabling firm bonding without causing a positional shift to be realized.

It is preferable that a tool for thermo-compression-bonding chips has an air-suction passage passing therethrough and air is sucked through the air-suction passage in a direction from the ceramic presser to the tool main body, thereby enabling suction holding of a chip on a chip-suction hole.

It is preferable that the ceramic holder, ceramic heater, ceramic presser or ceramic heater-presser is made of oxide ceramic or non-oxide ceramic. Though any of oxide ceramic and non-oxide ceramic can be used as a material of the ceramic presser, non-oxide ceramic is preferably used rather than oxide ceramic since a thermal conductivity of non-oxide ceramic can be adjusted.

BEST MODE FOR CARRYING OUT THE INVENTION

Hereinafter, detailed description will be given of preferred embodiments of the present invention with reference to the accompanying drawings.

Figure 1:
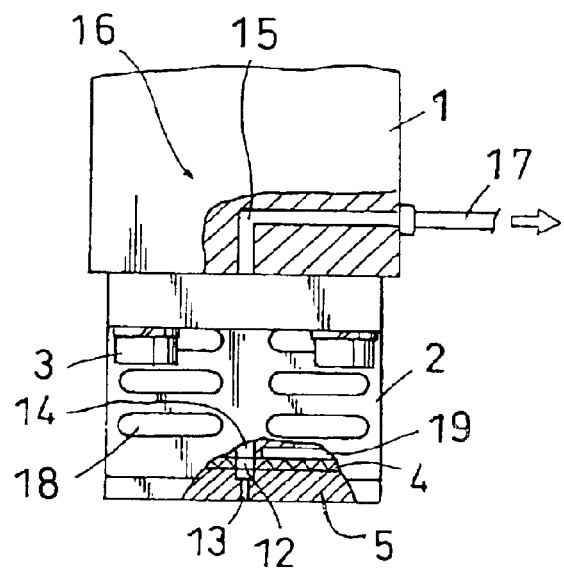
FIG. 1 is a front view showing a lower end portion of a tool for thermo-compression-bonding chips.
Figure 2:
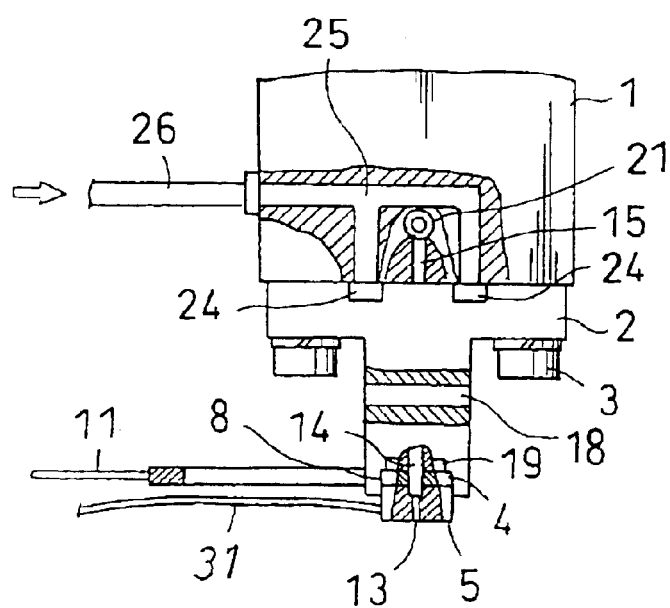
FIG. 2 is a left side view of FIG. 1.

In FIG. 1, which is a front view, and FIG. 2, which is a left side view of FIG. 1, a lower end portion of a tool for thermo-compression-bonding chips is shown and the lower end portion of the tool is of a configuration in which a ceramic holder 2 (a holder made of ceramic) is tightly fixed with a plurality of bolts 3 directly to the lower end of a tool main body 1 of metal and, also, a ceramic heater 4 and a ceramic presser 5 (a presser made of ceramic) are sintered at the lower end of the ceramic holder 2.

Figure 3:
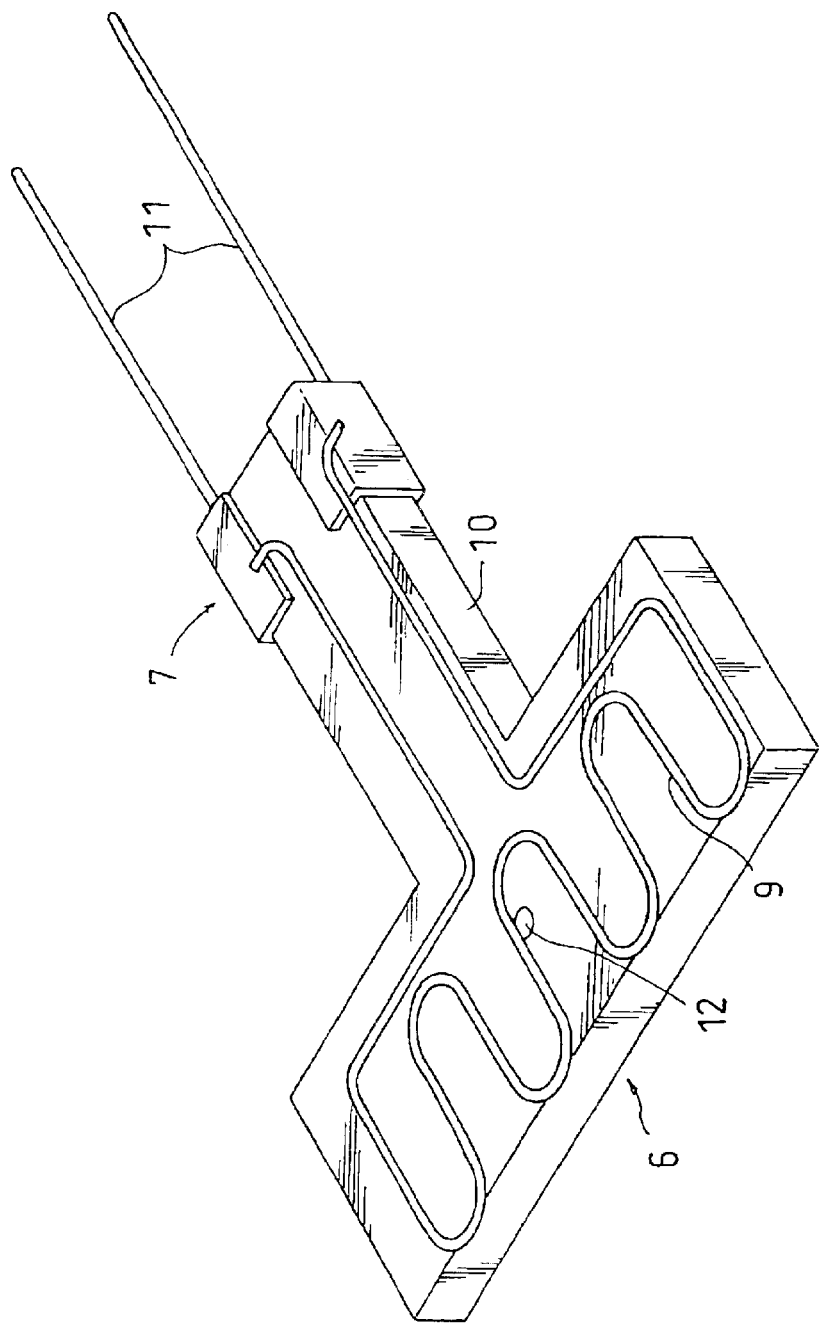
FIG. 3 is a perspective view showing a ceramic heater.

More specifically, as shown in FIG. 3, the ceramic heater 4 is formed in a panel, having a predetermined thickness (e.g., about 1 mm), where a heat generating section and terminal sections 7 are arranged in a T-shape. The heat generating section 6 of the ceramic heater 4 is fitted into an attaching recess 8 formed on the lower end surface of the ceramic holder 2 to be sintered to the ceramic holder. In addition, the upper end portion of the ceramic presser 5 is also fitted into the attaching recess 8 to be sintered to the ceramic holder 2 and ceramic heater 4. Herein, temperature detection means 31 (e.g., a thermocouple or a radiation thermometer) is mounted on the ceramic presser 5, thereby controlling temperature at a set temperature.

The sintering can be implemented at 1700 to 1800° C. under several thousands atm in a state where a binder mixed with silicon nitride powder and aluminum nitride powder, boron nitride powder or the like is applied onto the contact faces of respective components, thereby integrating the ceramic holder 2, ceramic heater 4 and ceramic presser 5 into a single piece. At this time, the heat generating section 6 of the ceramic heater 4 and the upper end portion of the ceramic presser 5 are fitted into attaching recess 8, so that a firm bonding can be realized without causing a positional shift.

Figure 4:
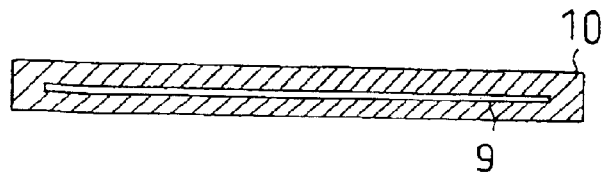
FIG. 4 is a vertical sectional view showing a heat generating section of a ceramic heater.

The ceramic heater 4 is, as shown in FIGS. 3 and 4 (a vertical sectional view of the heat generating section 6) configured so that the heat generating element 9 is embedded in the ceramic material 10, which is an electrically insulating material, wherein terminals 11 of the heat generating element 9 are protruded from the terminal sections 7 and, also, a connecting hole 12 is formed in the heat generating section 6 so as to pass through it. The connecting hole 12, as shown in FIG. 1, communicates with a chip suction hole 13 passing through the ceramic presser 5 and a connecting hole 14 passing through the ceramic holder 2.

Note that the ceramic holder 2, the ceramic material 10 of the ceramic heater 4, and the ceramic presser 5 are made of a material containing silicon nitride added with glass at a prescribed content. The coefficient of linear expansion of the ceramic holder 2 is equal to or approximately equal to those of the ceramic heater 4 and ceramic presser 5; furthermore, the thermal conductivities thereof are greater as the pressure surface side (the surface side at which the chip suction hole 13 is open) of the ceramic presser 5 as seen from the ceramic heater 4 is approached and are smaller as the attaching surface side of the ceramic holder 2 is approached. More specifically, the coefficient of linear expansion of the ceramic holder 2 is in the range from 2.6 to 3.2 $(\times 10^{-6})/°$ C., the coefficient of linear expansion of the ceramic heater 4 is in the range from 3.6 to 3.8 $(\times 10^{-6})/°$ C. and the coefficient of linear expansion of the ceramic presser 5 is in the range from 2.4 to 3.0 $(\times 10^{-6})/°$ C.; and the thermal conductivity of the ceramic presser 5 is 84 W/m·K and the thermal conductivity of the ceramic holder 2 is in the range from 17 to 84 W/m·K. More preferably, the coefficient of linear expansion of the ceramic holder 2 is 3.2 $(\times 10^{-6})/°$ C., the coefficient of linear expansion of the ceramic heater 4 is 3.6 $(\times 10^{-6})/°$ C. and the coefficient of linear expansion of the ceramic presser 5 is 3.0 $(\times 10^{-6})/°$ C.

In the case of not independently mounting the ceramic heater and ceramic presser as described above but mounting a ceramic heater-presser integrating the two components into a single piece, the coefficients of linear expansion thereof are the same or approximately same as each other and, also, the thermal conductivities thereof are smaller as the attaching portion of the ceramic holder is approached.

Ceramic materials have silicon nitride or the like (a main component) and glass or the like (an additive) as components. However, any material having a predetermined thermal conductivity can be selected since a thermal conductivity can be different according to a mixing amount of glass.

In FIG. 1, although the upper end of the connecting hole 14 is not shown, the connecting hole 14 communicates with the connecting hole 15 passing through the tool main body 1. In such a way, the connecting holes 12, 14 and 15 form the suction passage 16 communicating with the chip suction hole 13. Therefore, by sucking air through a pressure hose 17 attached to the tool main body 1, suction can be performed through the chip suction hole 13, thereby suction holding a chip (not shown) with the ceramic presser 5.

Figure 5:
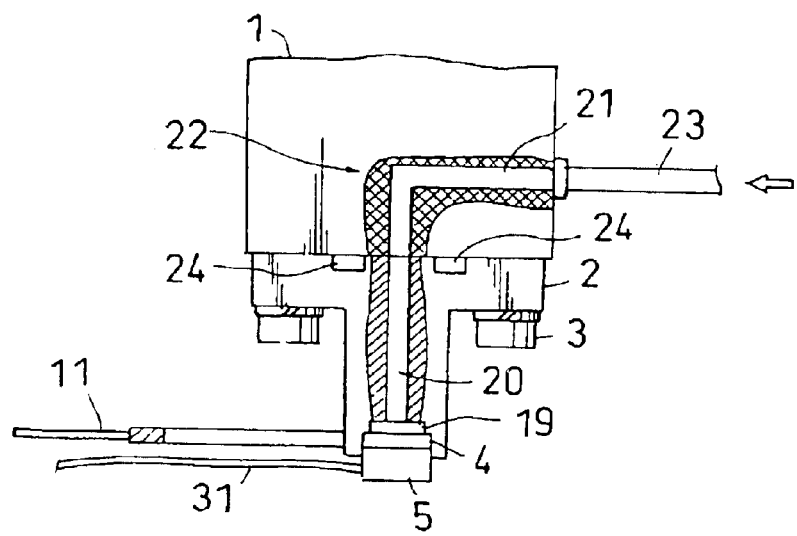
FIG. 5 is a left side view of FIG. 1.

In the ceramic holder 2, communication is established between a plurality of cooling slits 18 each in the shape of a long hole, a first air blowout passage 19 and a connecting holes 20 (see FIG. 5) pass therethrough and the first air blowout passage 19 is formed on the upper end surface of the heat generating section 6 of the ceramic heater 4 and open at both of left and right ends in FIG. 1.

The connecting hole 20 communicates with the first air blowout passage 19 and a connecting hole 21 (see FIG. 5) passing through the tool main body 1. In this way, first air supply passages 22 communicating with the first air blowout passage 19 are formed of the connecting holes 20 and 21.

Figure 6:
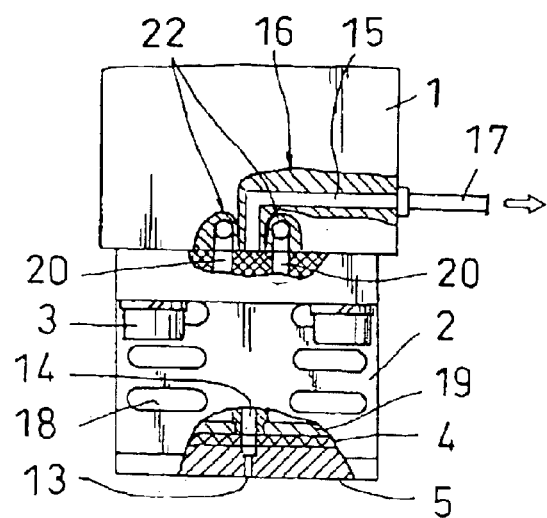
FIG. 6 is a front view of a lower end portion of a tool for thermo-compression-bonding chips.

The first air supply passages 22 are provided in a pair as shown in FIG. 6. Therefore, air is supplied through a pressure hose 23 (see FIG. 5) attached to the tool main body 1, thereby enabling a stream of air from openings at both of left and right ends of the first air blowout passage 19 to blow out.

With such a configuration adopted, since heat generated from the heat generating section 6 of the ceramic heater 4 is removed by the air, the ceramic heater 4 and ceramic presser 5 are rapidly cooled and, also, heat can be prevented from excessively transferring to the ceramic holder 2. In addition, by cooling the heated ceramic holder 2 using the cooling slit 18, the bonding portion between the ceramic holder 2 and the tool main body 1 of metal can be prevented from excessively heating.

Furthermore, as shown in FIG. 2, a pair of second air blowout passages 24 is provided on the upper end surface of the ceramic holder 2. The second air blowout passages 24 are open at both of front and rear ends, and second air supply passages 25 passing through the tool main body 1 communicate with the second air blowout passages 24, air is supplied through a pressure hose 26 attached to the tool main body 1 to thereby enable a stream of the air to blow out from openings at both of the front and rear ends of each of the second air blow-out passages 24 to thereby enable forcible cooling of the bonding portion between the ceramic holder 2 and the tool main body 1 of metal.

As described above, one tool for thermo-compression-bonding chips according to the present invention has a configuration that the ceramic holder 2, ceramic heater 4 and ceramic presser 5 mounted thereon are directly sintered to the lower end portion of the tool main body 1 having low coefficient of linear expansion and, also, the coefficient of linear expansion of the ceramic holder 2 is identical to or approximately equal to those of the ceramic heater 4 and ceramic presser 5; furthermore, the thermal conductivities of the ceramic holder 2 and ceramic presser 5 are greater as the pressure surface side of the ceramic presser 5 (surface side at which the chip suction hole 13 is opened) as seen from the ceramic heater 4 is approached and are smaller as the attaching surface side of the ceramic holder 2 is approached.

In the case of mounting a ceramic heater-presser formed by integrating a ceramic heater and ceramic presser into a single piece, the coefficients of linear expansion of both components (heater in the upper side and presser in the lower side) are same as or approximately same as each other and, also, the thermal conductivities thereof are smaller as the attaching surface of the ceramic holder is approached.

Therefore, even when thermo-compression-bonding (packaging) is successively performed by a bonding device with this tool for thermo-compression-bonding chips, it is possible to maintain the parallelism of the ceramic presser 5 within a specified range for a long period, thereby constantly performing the packaging with high precision.

Although not shown, a chip packaging device has a configuration that a substrate such as a liquid crystal substrate is supported by a substrate holding stage which is mounted so as to be capable of moving in a horizontal surface and, also, a packaging position on the substrate is precisely aligned with a chip suction-held in the tool for thermo-compression-bonding chips mounted above the packaging position by translation control or translation and rotation control on the stage, and then the tool for thermo-compression-bonding chips suction-holding the chip with the help of the chip suction hole 13 is lowered, thereby enabling thermo-compression bonding (packaging) of the chip to the substrate on the substrate holding stage.

Note that the substrate holding stage is mounted on a moving table capable of movement control thereon in the X and Y directions or the X, Y and e directions and, also, the tool for thermo-compression-bonding chips is mounted so as to be movable upwardly or downwardly in a vertical direction though not being movable in a horizontal direction. Other modes of configuration may be adopted. For example, a configuration may be adopted in which the tool for thermo-compression-bonding chips is mounted so as to be able to be rotated or moved in a horizontal direction.

While a tool for thermo-compression-bonding chips may have neither the air-suction passage 16 nor the chip-suction hole 13, the tool preferably has them since a high speed response in temperature control is enabled. While the ceramic holder 2, ceramic heater 4 and ceramic presser 5 may be made of any of oxide ceramic such as alumina or zirconia, and non-oxide ceramic such as aluminum nitride, boron oxide or silicon nitride, the ceramic presser 5 is preferably made of the latter ceramics rather than the former since a thermal conductivity of the latter can be adjusted compared with the former.

While the ceramic holder 2 is firmly fixed to the tool main body 1 with a proper adhesive, it is preferable to tightly mount the ceramic holder 2 with bolts so that in a case where the ceramic heater 4 receives damage or falls in another trouble, the ceramic holder 2 can be changed to another new one, and furthermore, another kind of a clamping mechanism may replace the use of bolts.

While the cooling slits 18 passing through the ceramic holder 2 is preferably used, the cooling slits 18 may be formed so as to each have a prescribed depth without passing through the ceramic holder 2 in full and not only is a prescribed number thereof selected according to a necessity, but the shape of each thereof may also be a prescribed one when required.

Figure 7:
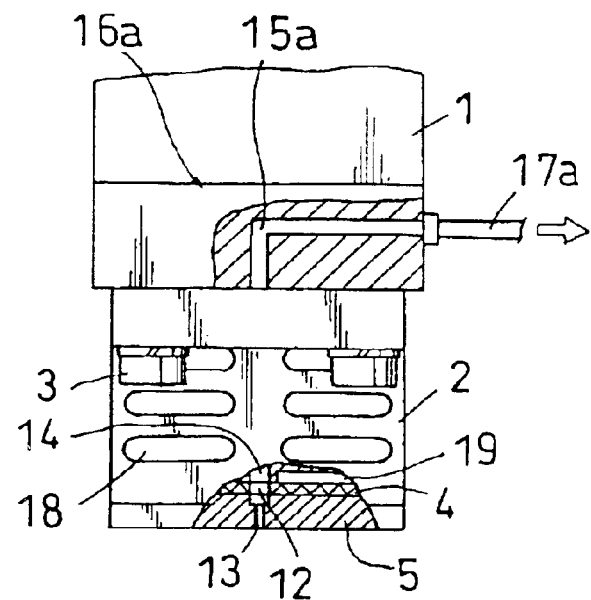
FIG. 7 is a front view of a lower end portion of a tool for thermo-compression-bonding chips.
Figure 8:
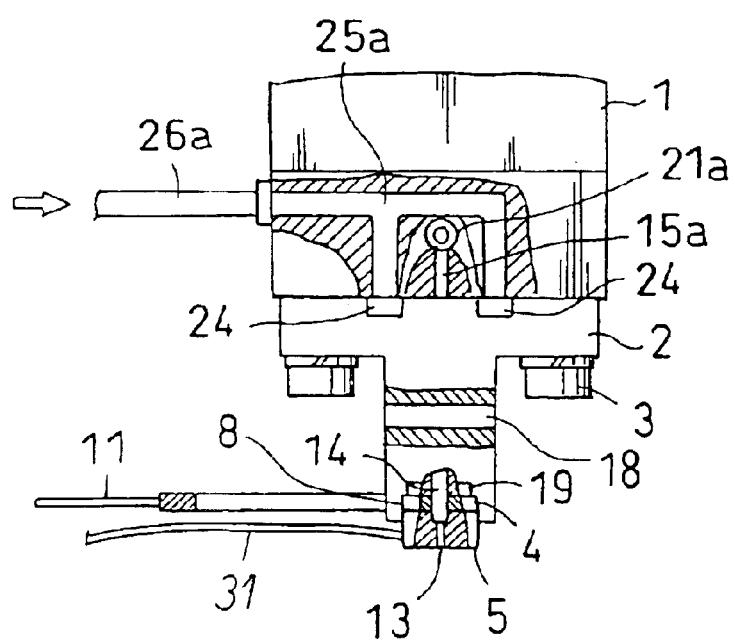
FIG. 8 is a left side view of FIG. 7.
Figure 9:
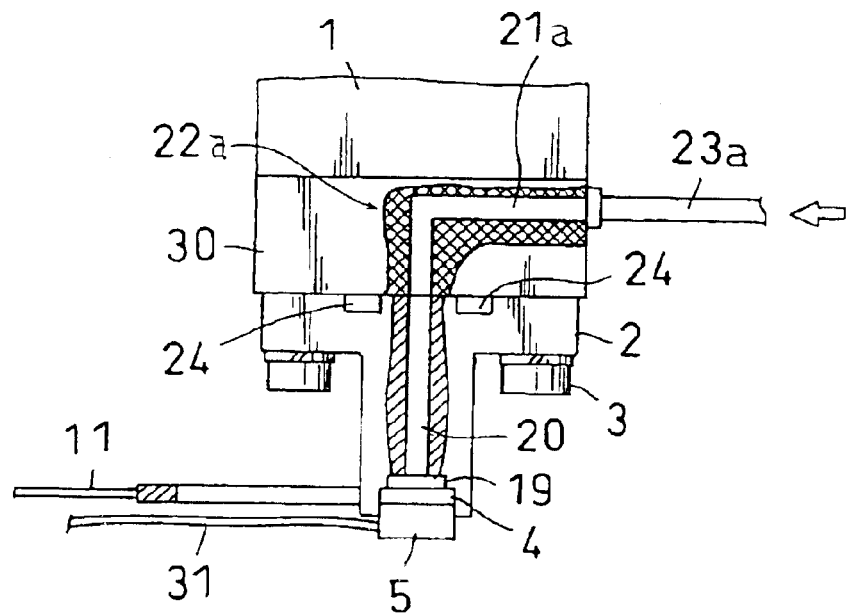
FIG. 9 is a left side view of FIG. 7.

While the above description is given of the case where the ceramic holder 2 is mounted directly on the lower end of the metal tool main body 1, a configuration may be adopted in the present invention in which as shown in FIGS. 7 to 9, a connecting block 30 is mounted on the lower end of the metal tool main body 1 and not only is the ceramic holder 2 mounted on the lower end of the connecting block 30, but the ceramic holder 2, ceramic heater 4 and ceramic presser 5 may be sintered to one another.

FIG. 7 is a front view, FIGS. 8 and 9 are left side views of FIG. 7 and as shown in the figures, a connecting hole 15a for forming an air-suction passage 16a passes through the connecting block 30 and, also, a connecting hole 21a for forming a second air-supply passage 25a and first air-supply passages 22a pass through the connecting block 30. The air-supply passages 22a are provided in pair at a prescribed spacing in arrangement in a direction, from front to rear in the FIG. 9, similar to the above described first air-supply passages 22 shown in FIG. 6; furthermore, pressure hoses 17a, 23a and 26a are attached to the connecting block 30.

Therefore, in a tool for thermo-compression-bonding chips having the connecting block 30 mounted on the lower end of the tool main body 1 of metal as well, a heat transfer from the heat generating section 6 of the ceramic heater 4 to the ceramic holder 2 can be suppressed similarly to the case of the tool for thermo-compression-bonding chips mounted with the ceramic holder 2 directly to the lower end of the tool main body 1 of metal.

Therefore, by enabling a rise and fall in temperature of the ceramic holder 2 to be smaller, no bolt is loosened and, also, elimination can be realized of elongation and deviation (deformation) of a parallelism due to thermal expansion of a tool main body having a parallelism adjusting function.

Note that, although not shown, the connecting block 30 is tightly fixed to the lower end of the metal tool main body 1 with bolts. Furthermore, not only a thermocouple 31 for measurement on temperature (see FIGS. 2 and 8) is mounted on the ceramic presser 5, but the tool main body 1 is mounted so as to be movable in an X, Y and Z directions not shown with a moving table capable of movement control thereon in the three axis directions.

The tool main body 1 may be mounted in other modes of movement, however, so as to enable, for example, movement only in the Z axis direction, rotation by a prescribed angle θ in addition thereto, and as for air supplied from the first and second air-supply passages 22 (or 22a) and 25 (or 25a) to the first and second air-blow-out passages 19 and 24, any of air at ordinary temperature and cooled air can be adopted.

As for the ceramic holder 2, a laminated type may replace an integrated type as described above (the type as shown in FIGS. 1 to 9). A two constituent laminated type is shown in FIGS. 10 and 11, in which the holder 2 is formed by sintering of a ceramic block 2a in the lower side and a ceramic block 2b in the upper side.

Note that both of the blocks 2a and 2b have approximately the same coefficients of linear expansion as each other and the thermal conductivity of the ceramic block 2b in the upper side is lower than that of the ceramic block 2b in the lower side. As in such a configuration, a two or more ceramic blocks, that is a plurality of ceramic blocks may also be laminated in such a manner that the thermal conductivities thereof become greater from the ceramic heater side toward the ceramic holder attaching portion, wherein a ceramic block having a lower thermal conductivity is laminated on a ceramic block having a higher thermal conductivity).

By providing the ceramic holder 2 of a lamination structure in this way, it can be more effectively prevented that a strain occurs due to a rise in temperature of the holder itself and the tool main body 1 having a parallelism adjusting function; therefore, it can be prevented that a parallelism of a tool for thermo-compression-bonding chips alters to outside a specified range in a short period.

Figure 10:
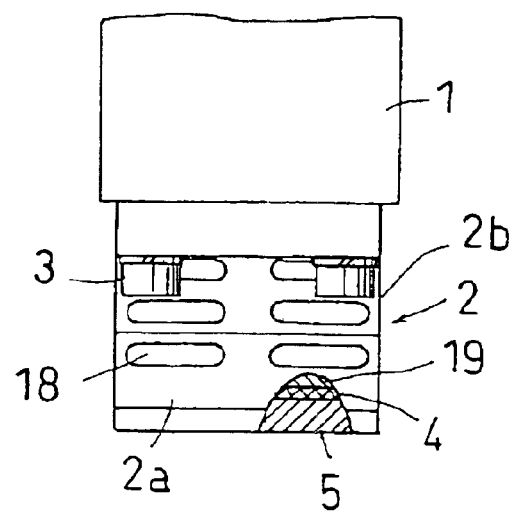
FIG. 10 is a front view of a tool for thermo-compression-bonding chips according to another embodiment.
Figure 11:
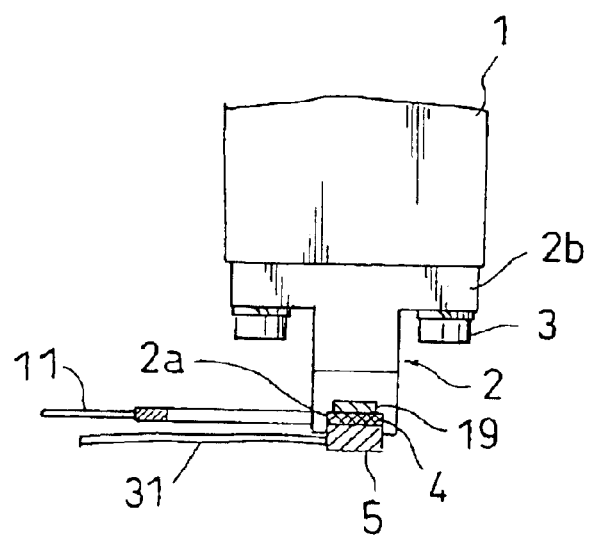
FIG. 11 is a left side view of FIG. 10.

Furthermore, while in the ceramic blocks 2a and 2b shown in FIGS. 10 and 11 described above, the blocks are laminated with a planar interface, the blocks may be laminated with a interface in the shape of a combination of depression and projection. This also applies to a case where blocks increase in number in a similar manner.

That is, in the ceramic holder 2 of any of the integrated type (a non-laminated type) and the laminated type, the ceramic heater 4 section high in temperature (for example, 250° C.), but the lower end of the tool main body 1 is low in temperature (for example, in the range from 30° C. to 50° C.). In the integrated type, however, a temperature rapidly decreases in a central portion of the ceramic holder 2; therefore, a thermo-deformation strain occurs due to the difference in temperature with ease, since in the laminated type, a temperature decrease not rapidly but gradually because of no presence of such a heat transfer preventive portion, therefore a strain is hard to occur, making the laminated type advantageous over the single piece type.

In the ceramic presser, ceramic plates are laminated in such a manner that the thermal conductivities thereof become smaller from the ceramic heater side toward the tool tip end side (the pressure surface side of the ceramic presser), and coefficients of linear expansion of the ceramic plates are the same or approximately the same as each other, thereby enabling neither influences of a strain and elongation associated with heat transfer to be eliminated.

As being apparent from the above description, there can be preferably exemplified as configuration modes: (1) a combination of a ceramic holder and a ceramic heater-presser; (2) a combination of a ceramic holder of a two or more block laminated type and a ceramic heater-presser; (3) a combination of a ceramic holder, a ceramic heater and a ceramic presser; (4) a combination of a ceramic holder of a two or more block laminated type and a ceramic presser; (5) a combination of a ceramic holder, a ceramic heater and a ceramic holder of a two or more block laminated type; (6) a combination of a ceramic holder of a two or more block laminated type, a ceramic heater and a ceramic presser of a two or more sheet laminated type; and others.

Note that as an ideal balance in thermal conductivity in the whole of a ceramic holder, a ceramic heater and a ceramic presser combined, a configuration is preferably adopted in which a thermal conductivity is smaller from the pressure surface of the ceramic presser toward the ceramic holder attaching portion, while since the ceramic heater is a heat generating source, the effect can be obtained even in a case outside the balance in thermal conductivity, and the same effect can be obtained in a case where a ceramic holder of a laminated type and a ceramic presser of a laminated type are combined and in a case where a ceramic holder and a ceramic heater are provided not separately but as a ceramic heater-presser instead of the separate combination.

A ceramic heater and a ceramic presser are firmly fixed to each other not only by sintering, but also by mounting in a removable manner if necessary, for example with a suction method, an electrostatic method, a mechanical clamping method or the like. Note that the temperature detecting means 31 may be mounted to the ceramic heater 4 or the ceramic holder 2, wherein the means is preferably mounted on a position closest to a chip-suction position.

While a ceramic holder, a ceramic heater and a ceramic presser are, in some cases, disposed in the substrate holding stage side, the ceramic heater and the ceramic presser are, in this case, sintered on the upper end of the ceramic holder mounted on the substrate holding stage, or alternatively, mounted on the substrate holding stage in a removable manner, for example with a suction method, an electrostatic method, a mechanical clamping method or the like, or in some other case, held on the substrate holding stage only by a gravitational force.

A chip used in the present invention means any of objects to be mounted or bonded to a substrate, such as a semiconductor chip, an IC chip, an optical element and a wafer, regardless of a kind or a size.

A substrate used in the present invention means any of objects to which a chip described above is mounted or bonded, such as a resin substrate, a glass substrate, a film substrate, a chip and a wafer.

INDUSTRIAL APPLICABILITY

As described above, a tool for thermo-compression-bonding chips according to the present invention and a chip packaging device having the tool are suitable for bonding by thermo-compression of an object to be packaged to the substrate with an adhesive or the like.

What is claimed is:

1. A tool for thermo-compression-bonding chips, comprising:

a tool main body;

a ceramic holder directly mounted on the lower end of the tool main body or mounted on the lower end of a connecting block mounted on the lower end of the tool main body; and a ceramic heater and ceramic presser sintered to the lower end of the ceramic holder, wherein the coefficient of linear expansion of the ceramic holder is approximately equal to those of the ceramic heater and ceramic presser, and the thermal conductivities of the ceramic holder and ceramic presser are greater as the pressure surface side of the ceramic presser as seen from the ceramic heater is approached and are smaller as the attaching surface side of the ceramic holder opposite to the pressure surface side is approached.

2. The tool for thermo-compression-bonding chips according to claim 1, wherein the ceramic holder is formed of a lamination of ceramic blocks in which each of ceramic blocks is sintered to each other.

3. The tool for thermo-compression-bonding chips according to claim 2, wherein the ceramic blocks are laminated in such a manner that the thermal conductivities thereof become greater from the ceramic heater side toward the tool main body side or connecting block side.

4. The tool for thermo-compression-bonding chips according to any of claims 1 to 3, wherein the ceramic presser is formed of a lamination of ceramic plates in which each the ceramic plates is sintered to each other.

5. The tool for thermo-compression-bonding chips according to claim 4, wherein the ceramic plates are laminated in such a manner that the thermal conductivities thereof become smaller from the ceramic heater side toward the tool chip end side (the pressure surface side of the ceramic presser).

6. The tool for thermo-compression-bonding chips according to claim 1, wherein the heat generating section of the ceramic heater and the upper end of the ceramic heater are fitted into and sintered to an attaching recess formed on the lower end surface of ceramic holder.

7. The tool for thermo-compression-bonding chips according to claim 1, wherein an air-suction passage is formed by a chip-suction hole passing through the ceramic presser and connecting holes passing through the ceramic heater, the ceramic holder and the tool main body or tool main body-connecting block, respectively, and air is sucked from the ceramic presser toward the tool main body through the air-suction passage, thereby suction-holding a chip on the chip-suction hole.

8. The tool for thermo-compression-bonding chips according to claim 1 wherein a cooling slit is provided on the ceramic holder in order to cool the ceramic holder, thereby preventing the bonding portion of the ceramic holder and the tool main body or connecting block from excessively being heated.

9. The tool for thermo-compression-bonding chips according to claim 1, wherein a first air-supply passage is formed by a connecting hole passing through the ceramic holder, a first air-blowout passage, formed on the upper end surface of the heat generating section of the ceramic heater, having both ends opened to the ceramic holder, and a connecting hole passing through the tool main body or tool main body-connecting block, and air is supplied from the tool main body through the first air-supply passage, thereby blowing out air from both openings of the first air-blowout passage.

10. The tool for thermo-compression-bonding chips according to claim 1, wherein air is supplied from the tool main body by connecting a second air-blow-out passage, formed on the upper end surface of the ceramic holder, having both ends opened to the ceramic holder, to a second air-supply passage passing through the tool main body, thereby blowing out air from both openings of the second air-blowout passage.

11. A tool for thermo-compression-bonding chips, comprising:

a tool main body;

a ceramic holder directly mounted on the lower end of the tool main body or mounted on the lower end of a connecting block mounted on the lower end of the tool main body; and a ceramic heater-presser sintered to the lower end of the ceramic holder, wherein the coefficient of linear expansion of the ceramic holder is approximately equal to that of the ceramic heater-presser, and the thermal conductivity of the ceramic holder is smaller as the attaching surface side of the ceramic holder as seen from the ceramic heater-presser is approached.

12. The tool for thermo-compression-bonding chips according to claim 11, wherein the ceramic holder is formed of a lamination of ceramic blocks in which each of ceramic blocks is sintered to each other.

13. The tool for thermo-compression-bonding chips according to claim 12, wherein the ceramic blocks are laminated in such a manner that the thermal conductivities thereof become smaller from the ceramic heater-presser side toward the tool main body or connecting block.

14. The tool for thermo-compression-bonding chips according to claim 1, wherein the ceramic holder, ceramic heater, ceramic presser or ceramic heater-presser is made of oxide based ceramic.

15. The tool for thermo-compression-bonding chips according claim 1, wherein the ceramic holder, ceramic heater, ceramic presser or ceramic heater-presser is made of non-oxide based ceramic.

16. The tool for thermo-compression-bonding chips according to claim 1, wherein
the ceramic holder is mounted on the tool main body or the connecting block with bolts.

17. A chip packaging device having a tool for thermo-compression-bonding chips according to claim 1.

18. The tool for thermo-compression-bonding chips according to claim 11, wherein
the ceramic holder, ceramic heater, ceramic presser or ceramic heater-presser is made of oxide based ceramic.

19. The tool for thermo-compression-bonding chips according to claim 11, wherein
the ceramic holder, ceramic heater, ceramic presser or ceramic heater-presser is made of non-oxide based ceramic.

20. The tool for thermo-compression-bonding chips according to claims 11, wherein
the ceramic holder is mounted on the tool main body or the connecting block with bolts.

21. A chip packaging device having a tool for thermo-compression-bonding chips according to claim 11.

* * * * *